United States Patent
Fendler et al.

(10) Patent No.: US 8,964,187 B2
(45) Date of Patent: Feb. 24, 2015

(54) MICRO-MACHINED IMAGING INTERFEROMETER HAVING A STATIC INTERFEROMETRIC CAVITY

(75) Inventors: Manuel Fendler, Grenoble (FR); Gilles Lafargues, Grenoble (FR); Nicolas Guerineau, Antony (FR); Sylvain Rommeluere, Massy (FR); Florence De La Barriere, Clichy-Sous-Bois (FR)

(73) Assignees: Commissariat a l'energie atomique et aux energies alternatives, Paris (FR); Office National d'Etudes et de Recherches Aerospatiales, Chatillon (FR)

( * ) Notice: Subject to any disclaimer, the term of this patent is extended or adjusted under 35 U.S.C. 154(b) by 289 days.

(21) Appl. No.: 13/578,379

(22) PCT Filed: Feb. 7, 2011

(86) PCT No.: PCT/EP2011/051760
§ 371 (c)(1),
(2), (4) Date: Sep. 7, 2012

(87) PCT Pub. No.: WO2011/098429
PCT Pub. Date: Aug. 18, 2011

(65) Prior Publication Data
US 2012/0327421 A1    Dec. 27, 2012

(30) Foreign Application Priority Data

Feb. 11, 2010   (FR) .................. 10 00562

(51) Int. Cl.
*G01J 3/45*   (2006.01)
*G01J 3/26*   (2006.01)
(Continued)

(52) U.S. Cl.
CPC .... *G01J 3/26* (2013.01); *G01J 3/02* (2013.01); *G01J 3/021* (2013.01); *G01J 3/0256* (2013.01); *G01J 3/0259* (2013.01); *G01J 3/2823* (2013.01); *G01J 3/4531* (2013.01)
USPC ............................ 356/454; 356/456; 356/512

(58) Field of Classification Search
CPC ........ G01J 3/26; G01J 3/0259; G01J 3/0256; G01J 3/02; G01J 3/021; G01J 3/4531; G01J 3/2823
USPC .......... 359/260, 581, 584, 585; 356/519, 454, 356/456
See application file for complete search history.

(56) References Cited

U.S. PATENT DOCUMENTS 4,054,389 A   10/1977  Owen
5,144,498 A    9/1992  Vincent
(Continued)

FOREIGN PATENT DOCUMENTS

EP   0 442 738 A2    8/1991
EP   0571022 A1 *  11/1993  ............... G01B 9/02
(Continued)

OTHER PUBLICATIONS

French Preliminary Search Report issued Oct. 26, 2010 in French Patent Application No. FR 1000562 filed Feb. 11, 2010 (with English translation of categories of cited documents).
(Continued)

*Primary Examiner* — Tarifur Chowdhury
*Assistant Examiner* — Michael P Lapage
(74) *Attorney, Agent, or Firm* — Oblon, Spivak, McClelland, Maier & Neustadt, L.L.P.

(57) ABSTRACT

A micro-machined optical measuring device including: a set of photosensitive detector elements situated on a given face of a first support; a second support, assembled to the first support, forming a prism and including a first face through which a visible radiation is intended to penetrate and a second face, forming a non-zero angle θ with the first face and a non-zero angle α with the given face of the first support, the second face being semi-reflective, the first support and the second support being positioned such that an interferometric cavity is made between the second face and the given face, the distance between the given face of the first support and the second face of the second support varying regularly.

17 Claims, 2 Drawing Sheets

(51) Int. Cl.
*G01J 3/02* (2006.01)
*G01J 3/28* (2006.01)
*G01J 3/453* (2006.01)

(56) References Cited

U.S. PATENT DOCUMENTS

| | | | |
|---|---|---|---|
| 5,574,285 A * | 11/1996 | Marion et al. | 250/370.13 |
| 5,608,456 A * | 3/1997 | Tokuda | 348/340 |
| 6,381,022 B1 | 4/2002 | Zavracky | |
| 6,566,170 B1 | 5/2003 | Marion et al. | |
| 7,330,266 B2 | 2/2008 | Guerineau et al. | |
| 2004/0239939 A1* | 12/2004 | Guerineau et al. | 356/454 |
| 2006/0039009 A1 | 2/2006 | Kiesel et al. | |
| 2007/0076210 A1 | 4/2007 | Kiesel et al. | |
| 2008/0186508 A1 | 8/2008 | Kiesel et al. | |
| 2010/0032551 A1* | 2/2010 | Schulz et al. | 250/208.2 |
| 2010/0040981 A1* | 2/2010 | Kiesel et al. | 430/311 |
| 2010/0065725 A1* | 3/2010 | Blanc et al. | 250/226 |
| 2010/0123899 A1 | 5/2010 | Fendler et al. | |
| 2013/0340991 A1 | 12/2013 | Lasfargues et al. | |

FOREIGN PATENT DOCUMENTS

| | | |
|---|---|---|
| EP | 1 630 532 A1 | 3/2006 |
| FR | 2 780 200 A1 | 12/1999 |

OTHER PUBLICATIONS

International Search Report and Written Opinion issued Mar. 23, 2011 in PCT/EP2011/051760 filed Feb. 7, 2011.

* cited by examiner

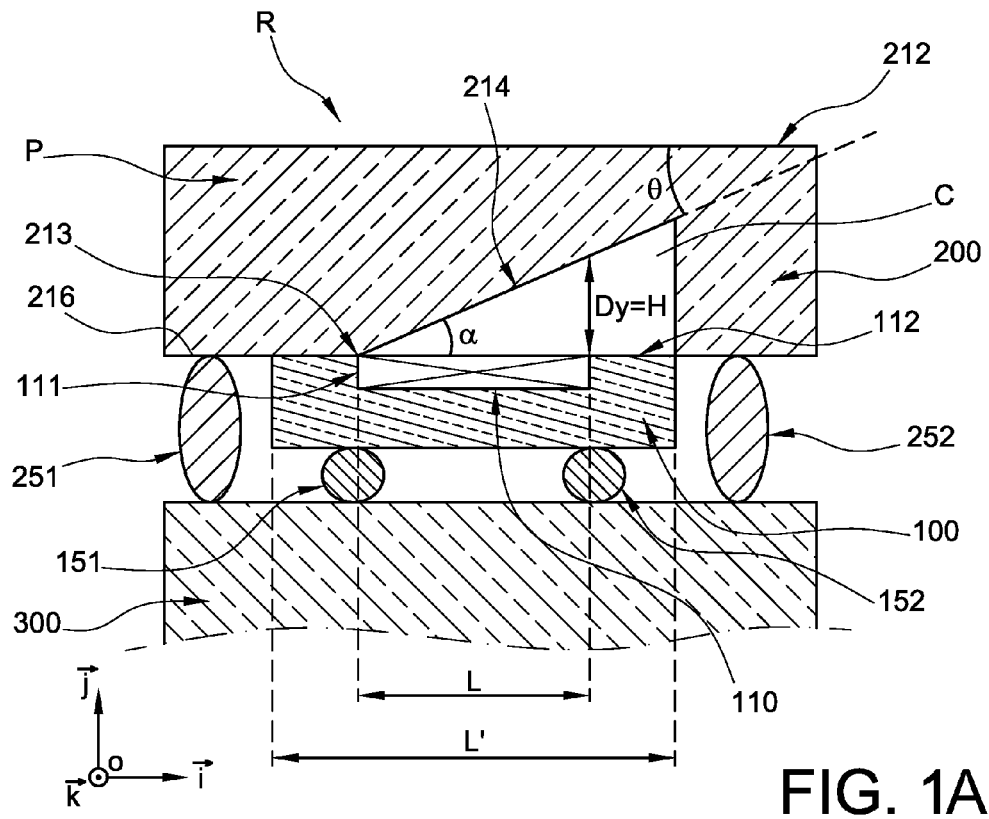
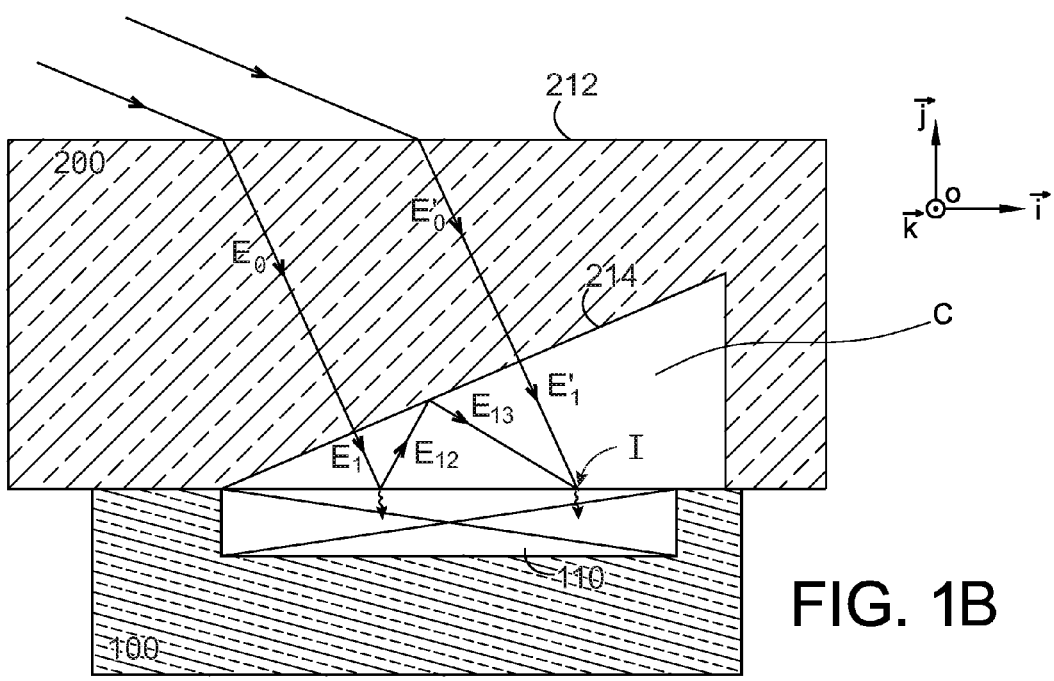

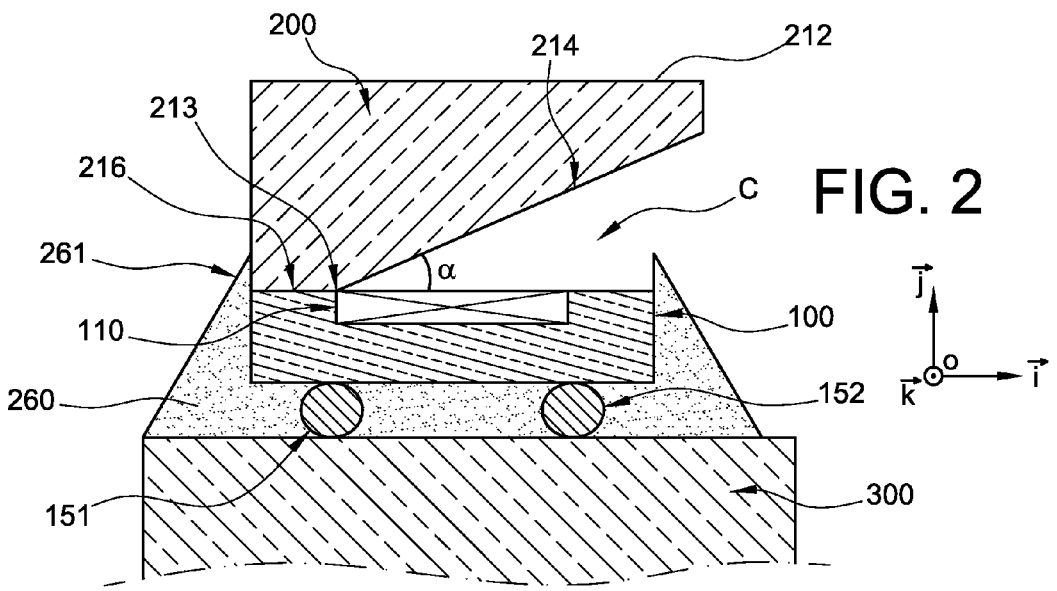
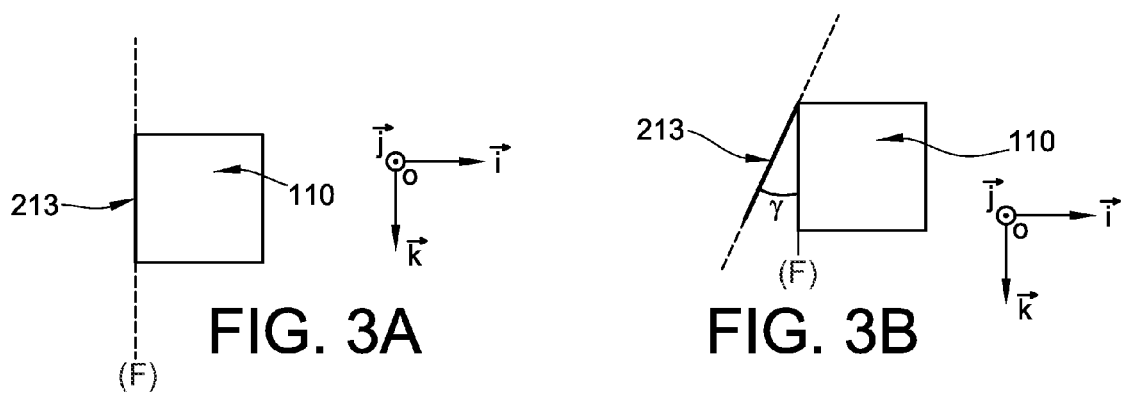
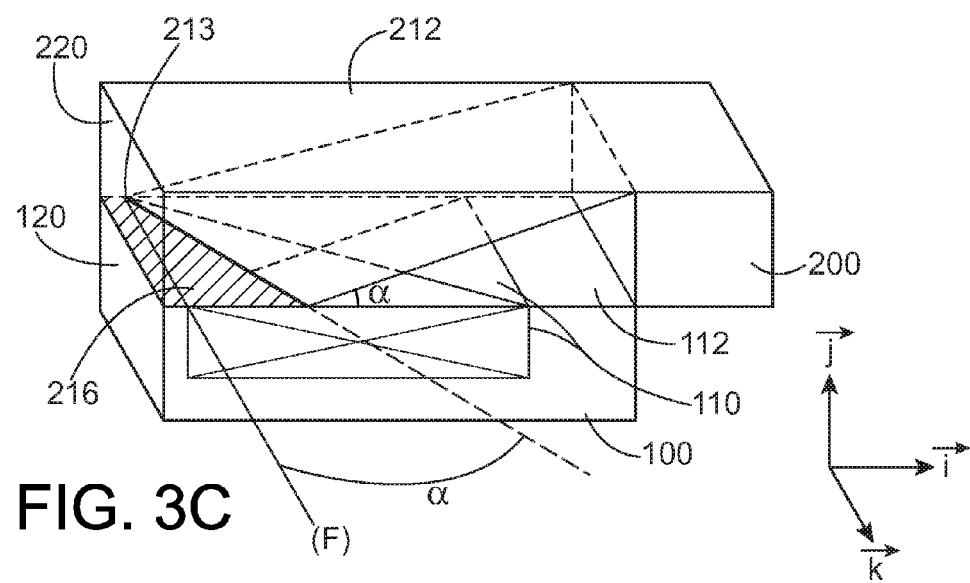

MICRO-MACHINED IMAGING INTERFEROMETER HAVING A STATIC INTERFEROMETRIC CAVITY

TECHNICAL FIELD

The present invention relates to the field of micro-machined optical measuring devices and in particular that of spectrometer devices, provided with co-integrated static interferometer and imaging functions.

BACKGROUND OF THE INVENTION

It is known to make micro-machined spectrometer devices.

Document U.S. Pat. No. 7,330,266 B2 for example discloses a static Fourier transform spectrometer provided with an interferometer function done using a strip having a first planar face situated on the detection zone of an imager, and a second planar face, which is inclined relative to the first planar face, and performs a semi-reflective diopter function. The strip is formed from the substrate on which the imaging was done.

An interferogram, mapping of the interferences that occur, is obtained in a single acquisition by the imager, without a transfer lens being necessary between the interferometric block and the imager. This spectrometer is pre-adjusted.

However, the production of such a device is problematic. It in fact requires a polishing step of the substrate on which the imager has been formed, in order to produce the inclined face making the semi-reflective diopter. This polishing step is delicate, inasmuch as it involves making a planar surface at the end of the manufacturing process, without destroying the detection zone of the imager. However, if this polishing step is not done correctly, the entire manufacturing process must be reiterated, including the production of the imager.

The problem arises of finding a new way of making a micro-machined optical measuring device co-integrating an interferometer function and an imaging function, and that does not require a transfer lens between the element performing the function of interferometer and the imager.

BRIEF DESCRIPTION OF THE INVENTION

The invention first relates to an optical measuring device comprising:
  a set of photosensitive detector elements situated on a given face of a first support,
  a second support, assembled to the first support, the second support being provided with a first face through which a visible radiation is intended to penetrate and a second face, forming a non-zero angle θ with said first face and a non-zero angle α with said given face of the first support,
  the second face forming a semi-reflective interface or strip, the first support and the second support being positioned such that an interferometric cavity is made between the second face and said photosensitive detector elements, the distance between said given face of the first support and said second face of the second support varying regularly.

The first face of the first support forms a first diopter while the second face of the second support forms a second diopter.

The photosensitive detector elements can belong to an imager. According to one advantage of the device according to the invention, these elements can have been formed independently of the second support, then assembled with said second support.

Thus, the device according to the invention is provided on one hand with an interferometer function or means forming an interferometer, and on the other hand, an imaging function or means forming an imager.

The interferometric cavity or the cavity is a space delimited by the surface of the photosensitive detector elements (first diopter) and the semi-reflective surface of the second support (second diopter). The cavity can advantageously be an air cavity. This cavity is formed after assembly of the second support on the first support. The surfaces of the cavity form an angle so that they are not parallel to each other.

Preferably, said diopters are not parallel and their positions are constant over time, so as to form a static interferometric cavity.

Said first face of the second support can have undergone an anti-reflection treatment. Such a treatment is provided so as to increase the transmission coefficient, on one hand, and on the other hand, to prevent multiple reflections of the light in the second support. Such a treatment can be done by deposition of an anti-reflection layer, for example ZnS-based in the case of infrared applications.

The second face of the second support can have been polished, for example using a lapping or micro-milling method, so as to be partially reflective.

The second support can be provided with a third face, parallel to and in contact with said given face of the first support. This third face serves in particular to facilitate the positioning and assembly of the first support and the second support.

According to one possible arrangement, an edge separating said third face and said second face of the second support can be positioned so as to run along a border of the set of photosensitive elements.

Thus, certain photosensitive detector elements can be arranged precisely so as to detect zero-order fringes.

According to another possible arrangement, said edge can form a non-zero angle γ with a border of the set of photosensitive detector elements.

This makes it possible to incline the interference fringes relative to the axes of the imager and increase the free spectral interval of said imager. Advantageously, said edge can be positioned relative to the first support, using the geometry of the first and second supports for assistance.

The second support can be kept in contact with the first support, via fastening means between the first support and the third support. The fastening means can be means used in the opto-mechanics or microtechnology fields. These fastening means can be balls or lugs or shims. The second support can for example be kept, by a glue, in contact with the first support, via beads of that glue.

Such fastening means can allow a precise arrangement of the second support relative to the first support.

The photosensitive detector elements can be situated near or in the imager plane or image plane of the second diopter, this plane being made up of the photosensitive detector elements.

According to one advantage of the present application, the first and second supports delimiting the interferometric cavity or the cavity are made independently. It is thus possible to control the state of the supports before they are assembled.

The assembly of the supports makes it possible to form said interferometric cavity, in which two waves can interfere, having shared spectrum portions, near or on the surface of the first diopter.

According to another advantage of the device according to the invention, and contrary to certain interferometers according to the prior art, it is not necessary to provide a transfer lens between the imager and the semi-reflective interface or strip.

The photosensitive detector elements can detect the difference in light intensity present on their surface. The distance between two different light intensity values can thus be measured. These photosensitive elements are preferably sensitive to an incident radiation between the ultraviolet and the far infrared. The spectral band detected by the photosensitive detector elements is between a maximum wavelength that can be set by the characteristics of the photosensitive detectors, and a minimum wavelength defined by the optical transmission characteristics of the elements positioned on the optical path of the light, upstream of the imager plane. The photosensitive detector elements can belong to a detection circuit connected to a reading circuit.

The reading circuit can be integrated into a third support, the first support and the third support being assembled via conducting elements such as conductive balls also making it possible to ensure an electric connection between the reading circuit and the detection circuit.

It is possible to connect the reading circuit to a means for processing the signal. The intensity of an electromagnetic field or the light intensity on the surface of the photosensitive detector elements can then be determined, by Fourrier transform, after sampling, as a function of its frequency.

The invention relates in particular to a device making it possible to produce an interferogram. To that end, the device includes an interferometric cavity whereof one wall is made up of photosensitive elements. The surface of these photosensitive elements is partially reflective to, on one hand, allow the reflection of part of the waves present in the cavity and, on the other hand, detect the presence of those waves. The assembly of the first support and the second support therefore makes it possible to produce a static interferometric cavity whereof one wall is made up of photosensitive elements. The invention also in particular relates to an interferometry device.

One of the advantages of such a device is to be able to produce, from photosensitive elements, an interferogram formed on the surface or near the surface of the first diopter. The interferogram can be recorded by the photosensitive elements, without transfer lens between the element performing the interferometric function and the imager. The invention also relates to an imager interferometry device.

Another advantage of a device according to the invention is the possibility of connecting the photosensitive elements to a means for processing the signal to process the signal of the interferograms and to determine, for example, the spectral characteristics of the waves that interfere on the surface of the photosensitive elements. The invention also concerns a spectrometry device.

The preceding devices offer the possibility of going from an interferometric device to a device able to measure the interferograms produced in said cavity and/or study the spectral properties of the waves forming the interference figures, without modifying the structure or geometry of the devices.

The above devices can be micro-machined so as to produce, at micrometric dimensions, these devices, such as a micro-spectrometer or an imaging micro-interferometer.

BRIEF DESCRIPTION OF THE DRAWINGS

The present invention will be better understood upon reading the description of embodiments, provided purely for information and non-limitingly, in reference to the appended drawings, in which:

FIGS. 1A and 1B illustrate a first example of a micro-machined optical detection device according to the invention provided with an electromagnetic radiation detection function and means forming an interferometer in the form of a beveled support, FIG. 2 illustrates a second example of a micro-machined optical detection device according to the invention provided with an electromagnetic radiation detection function and means forming an interferometer in the form of a beveled support, FIGS. 3A, 3B, 3C illustrate two alternative arrangements of a semi-reflective interface or strip relative to an imager within an electromagnetic radiation detection device according to the invention.

Identical, similar or equivalent parts of the different figures bear the same numerical references so as to facilitate the transition from one figure to the next.

The different parts illustrated in the figures are not necessarily shown using a uniform scale, to make the figures more legible.

DETAILED DESCRIPTION OF SPECIFIC EMBODIMENTS

An example of a micro-machined optical measuring device according to the invention will now be provided in connection with FIG. 1.

This device comprises an electromagnetic radiation detector imager, formed on a first support 100, which can be a semiconducting substrate, for example with a base of CdHgTe in the case of an infrared detector.

The imager is provided with a plurality of photosensitive detector elements 110 formed on the substrate and positioned on a given face 112 thereof. The surface of the photodetectors is semi-reflective. The imager can, for example, be an imager intended to detect radiation between the ultraviolet and the far infrared. The spectral band detected by the photosensitive detector elements is between a maximum wavelength that can be set by the characteristics of the photosensitive detectors, and a minimum wavelength defined by the optical transmission characteristics of the elements positioned on the optical path of the light, upstream of the imager plane. For example, the maximum wavelength can be set by the choice of the alloy, which determines the cut-off wavelength of the photosensitive elements. In the particular case of CdHgTe detectors operating in the middle infrared, the detected spectral band can be between 3 µm and 5 µm. The minimum detected wavelength is, in general, determined by the transmission of a shielding window or filter positioned on the path of the light upstream of the image plane.

The photosensitive detector elements can be arranged in a matrix.

The photosensitive detector elements are part of an imager detection circuit that can be integrated into the first support 100. The detection circuit is provided to perform a detection and quantitative analysis of the spectral content of light waves, each point of a scene observed by the imager and the spectral signature thereof being able to be associated to do the spectro-imaging. Thus, the optical measuring device according to the invention is provided with a spectrometer function.

The photosensitive detectors can be arranged in the form of a matrix, for example a rectangular shape, with a length L, for example in the vicinity of 9.6 mm (measured in a direction parallel to the direction of the vector $\vec{i}$ of an orthogonal reference $[O; \vec{i}; \vec{j}; \vec{k}]$ indicated in FIG. 3) and a width for example in the vicinity of 7.7 mm, values which correspond, in this example, to a matrix of 320×256 pixels with a pitch of 30 µm.

The optical measuring device comprises means performing an interferometer function, using a second support 200.

The second support 200 includes a first face 212 forming a first planar diopter.

The first face 212 can have undergone an anti-reflection treatment, for example by ZnS for infrared applications in order to limit reflection phenomena of the incident light R.

The second support 200 includes a second face 214 called "inclined face" forming a second planar diopter and making a non-zero angle $\theta$ with the first face 212 of the second support 200.

The photosensitive detector elements are situated in the image plane of the second diopter, i.e. the waves in the cavity interfere at the surface or near the surface of the photosensitive detector elements.

The second face 214 also makes a non-zero angle $\alpha$, with said given face 112 of the first support 100 (said given face 112 being situated in a plane parallel to the plane $[O; \vec{i}; \vec{k}]$). The angle $\alpha$ is a non-zero angle and can be equal to $\theta$. The angle $\alpha$ can be smaller than 45°.

The second support 200 can be a substrate made from a material that can be substantially transparent or transparent to the incident radiation R, for example a crystalline material with a base of semiconducting material such as Si or Ge or CdTe/CdZnTe, for example.

According to other possibilities, the material of the second support 200 can for example be ZnSe, ZnS, or $CaF_2$ in particular in the case where the detection is done in the infrared field.

The first support 100 and the second support 200 are arranged so that a cavity C is formed between the inclined face 214 of the second support 200 and said given face 112 of the first support 100. Preferably, the cavity C is not resonant.

The distance Dy between said given face 112 and said inclined face 214, measured in a direction parallel to the direction of the vector $\vec{j}$ of an orthogonal reference $[O; \vec{i}; \vec{j}; \vec{k}]$ indicated in FIG. 3, varies regularly in a direction parallel to the vector $\vec{i}$. Preferably, the two supports are fixed relative to each other, so that the second surface 214 of the second support 200 and the surface of the photosensitive detector elements 110 form a static interferometer.

Thus, the distance Dy separating each sensitive detector at the inclined face 214 varies from one detector to the next. The arrangement of the inclined face 214 of the second support 200 relative to the matrix of detectors can be provided so that the distance Dy varies from 0 to a non-zero value H. H can be less than 1 mm, for example in the vicinity of 384 µm.

The cavity C, separating the inclined face 214 of the second support from the detection face 112 of the first support 100, can advantageously be an air cavity.

The inclined face 214 of the second support can have been made by machining the substrate, for example by polishing. The inclined face 214 has been polished by mirror-appearance polishing, for example by lapping, or micro-milling, so as to limit the diffusion of radiation from the cavity C towards the second support. The inclined face 214 thus plays the role of semi-reflective face.

The second support 200 and the imager have each been made independently, then assembled.

The imager can have been made collectively, for example, i.e. at the same time as other imagers.

The second support 200 can be assembled to the first support 100, such that it rests thereon, another face 216 of the second support 200, being in contact with and parallel to the face 112 of the first support 100 on which the photosensitive detector elements are arranged.

An edge 213 separates the inclined face 214 from said face 216 of the second support 200 against which the first support 100 is placed.

This edge 213 can have been positioned and be situated according to a first possibility, along a border 111 of the set of photosensitive detection elements. FIG. 3A illustrates such positioning of the edge 213 in the case of a set of photosensitive detectors having a rectangular boundary.

It is thus possible to obtain zero-order fringes at the boundary, or on the border 111, of the set of photosensitive detector elements. The cavity C thus has the shape of a prism with a triangular base.

According to another possible arrangement, the semi-reflective inclined face 214 can be disoriented, such that the edge 213 separating said inclined face 214 from the other face 216 of the second support 200 make an angle $\gamma$ relative to a border 111 of the detector (FIG. 3C).

The first and second supports can have shapes and dimensions adapted to facilitate the positioning of the edge 213 and the second support 200 on the first support 100. The edge 213 can be positioned via references, for example, the edge can be positioned in the direction defined by the axis $\vec{i}$ of reference $[O; \vec{i}; \vec{j}; \vec{k}]$, when the face 120 of the first support 100 and the face 220 of the second support 200 are aligned in a same plane $[O; \vec{j}; \vec{k}]$. Likewise, the desired positioning of the edge in the direction defined by the axis $\vec{j}$ of the previous reference can be obtained when the faces of the first and second supports, perpendicular to the preceding plane, are aligned in a same plane $[O; \vec{j}; \vec{k}]$. Such an embodiment is facilitated by the fact that, before being assembled, the first support 100 and the second support 200 are independent.

FIGS. 3B and 3C illustrate such a positioning of the edge 213 in the case of a set of photosensitive detectors having a rectangular boundary F.

FIG. 1B illustrates the operation of the interferometer, which can be as follows:

When an incident wave E0 passes through the first interface 212 and falls at normal incidence on the second interface 214 of the second support 200, a large portion E1 of the wave E0 passes through the semi-reflective face 214. The majority of the wave E1 is absorbed by a photosensitive element 110 and a minority E12 is reflected by the bare surface of said photosensitive elements towards the semi-reflective face 214. The surface of the photosensitive detectors is semi-reflective. The surface of these elements is used here as wave detecting means, but also as means to separate an incident wave E1 into a wave absorbed by the photosensitive elements and a wave E12 reflected by the surface of said elements. The wave E12 is in turn partially or completely reflected by the semi-reflective face 214 in a reflected wave E13. The wave E13 is then capable of interfering with a wave E'1, as shown in FIG. 1b, in the image plane of the second support, situated at the upper face of the photosensitive detector elements. The device according to the invention is therefore an interferometric device of the static interferometer type with two waves having at least partially the same spectral content. Part of the wave E0 travels over a more significant optical path than the wave E'0 to reach the point I on the surface of the photosensitive elements. The successive reflections of part of the wave E0 on the interfaces of the cavity shift the phase of that wave relative to the wave E'0. Part of the wave E0 (E13) therefore interferes with part of the wave E'0 (E'1) due to the path difference between the two waves. The value of that path difference depends on the wavelength and the angle formed by the surfaces 214 and the surface of the photosensitive elements. The surface of the photosensitive elements and the surface 214 make it possible to produce an interferogram on or near the surface of the photosensitive elements.

These elements can transmit the intensity variation of the light signal or the wave, via a reading circuit, to an electronic spectral analysis means that can also be integrated into the third support 300. A device according to the invention can be a spectrometer, of the Fourier transform static spectrometer type, including photosensitive detector elements without transfer lens between the means performing the interferometer function and the means performing the imager function.

An alternative of the example of the device just described is provided in FIG. 2.

For this alternative, the second support 200 is kept in contact with the first support 100 via a glue 260 coating the first support and that is positioned between the first support 100 and the third support 300, as well as on either side of the first support 100. Beads 261 of glue 260 make it possible to fasten the second support 200 to the first support 100.

The assembly between the three supports 100, 200, 300 can be done as follows:

The first support 100 is first fastened on the third support 300 provided with a reading card, for example using conductive balls 151, 152.

A polymerizable material 260 is then deposited between the conductive balls 151, 152 used for the connection and hybridation of the supports 100 and 300. This material 260 comes up by capillarity on the edges of the first support 100 and forms beads 261.

A polymerization is then done of the material 260 that then acts as a glue. A mechanical thinning of the first support 100 by polishing can be done. The beads 261 of glue are used to position and fasten the second support 200 on the first support 100.

The positioning can be done using a hybridation machine, for example as used in the component fastening in "flip chip" methods.

Then, a thermo-compression cycle can make it possible to finalize the gluing by polymerization of a thixotropic glue that has just been added on the periphery of the support 200, in contact with the glue 261.

Comparative tables, corresponding to different embodiments of a device according to the invention, and in particular different examples of the cavity C and different examples of the material for the second support 200, are provided.

In these tables, the expression "architecture 1" designates the embodiment of FIG. 1, while the expression "architecture 2" designates the embodiment of FIG. 2.

| Air cavity C | $N_1 = 1$ |
|---|---|
| Angle α of the prismatic cavity | 40 mrad ± 2 mrad |
|  | 2.3° ± 0.01° |
| Spectral resolution | 8.1 cm$^{-1}$ |
| Maximum angular diameter of the source | 8.9° |
| Correction angle for architecture 2 | 2.3° |

| | Material of the support 200 | | | | | |
|---|---|---|---|---|---|---|
| | Ge | Si | CdTe/CdZnTe | ZnSe | ZNS | CaF$_2$ |
| Contrast of the fringes | 0.6 | 0.56 | 0.49 | 0.44 | 0.41 | 0.19 |
| Average transmission coefficient of the upper strip | 0.32 | 0.37 | 0.45 | 0.49 | 0.52 | 0.65 |
| Transmission coefficient with anti reflection treatment | 0.49 | 0.52 | 0.57 | 0.6 | 0.61 | 0.67 |
| Correction angle architecture 1 | −4.4° | −3.2° | −1.6° | −0.92° | −0.46° | −1.4° |
| Color of the central fringe | White | White | White | White | White | White |

| Cavity C made from CaF2 | $N_1 = 1.4$ |
|---|---|
| Angle α of the prismatic cavity | 28 mrad ± 2 mrad |
|  | 0.85° ± 0.01° |
| Spectral resolution | 8.1 cm$^{-1}$ |
| Maximum angular diameter of the source | 12° |
| Correction angle for architecture 2 | 2.9° |

| | Material of the support 200 | | | | |
|---|---|---|---|---|---|
| | Ge | Si | CdTe/CDznTe | ZnSe | ZNS |
| Contrast of the fringes | 0.4 | 0.35 | 0.27 | 0.23 | 0.19 |
| Average transmission coefficient of the upper strip | 0.42 | 0.48 | 0.58 | 0.63 | 0.66 |
| Transmission coefficient with anti-reflection treatment | 0.65 | 0.69 | 0.74 | 0.76 | 0.77 |
| Correction angle architecture 1 | −1.8° | −0.98° | −0.16° | −0.6° | −0.98° |
| Color of the central fringe | White | White | White | White | White |

| Cavity C made from ZnS | $N_1 = 2.2$ |
|---|---|
| Angle α of the prismatic cavity | 18 mrad ± 2 mrad |
|  | 0.85° ± 0.01° |
| Spectral resolution | 8.1 cm$^{-1}$ |
| Maximum angular diameter of the source | 19.5° |
| Correction angle for architecture 2 | 3.5° |

| | Material of the support 200 | | | | |
|---|---|---|---|---|---|
| | Ge | Si | CdTe/CDZnTe | ZnSe | CaF$_2$ |
| Contrast of the fringes | 0.13 | 0.1 | 0.05 | 0.02 | 0.11 |
| Average transmission coefficient of the upper strip | 0.57 | 0.63 | 0.74 | 0.78 | 0.87 |
| Transmission coefficient with anti-reflection treatment | 0.87 | 0.9 | 0.93 | 0.94 | 0.9 |
| Correction angle architecture 1 | −0.52° | 1° | 1.8° | 2.1° | 3.1° |
| Color of the central fringe | White | White | White | White | Black |

| Cavity C made from ZnSe | $N_1 = 2.4$ |
|---|---|
| Angle α of the prismatic cavity | 17 mrad ± 2 mrad |
|  | 0.85° ± 0.01° |
| Spectral resolution | 8.1 cm$^{-1}$ |
| Maximum angular diameter of the source | 21° |
| Correction angle for architecture 2 | 3.6° |

-continued

| | Material of the support 200 | | | | |
|---|---|---|---|---|---|
| | Ge | Si | CdTe/CdZnTe | ZnSe | CaF$_2$ |
| Contrast of the fringes | 0.1 | 0.07 | 0.02 | 0.02 | 0.1 |
| Average transmission coefficient of the upper strip | 0.59 | 0.65 | 0.75 | 0.82 | 0.87 |
| Transmission coefficient with anti-reflection treatment | 0.91 | 0.93 | 0.96 | 0.96 | 0.9 |
| Correction angle architecture 1 | 0.9° | 1.3° | 2° | 2.5° | 3.2° |
| Color of the central fringe | White | White | White | Black | Black |

These tables show that better results are obtained when the cavity C is an air cavity.

With either of the examples of devices according to the invention that were previously described, it is possible to obtain a transmission coefficient product multiplied by the contrast of the improved fringes that can be in the vicinity of 30%.

Other characteristics of example of devices implemented according to the invention are provided in the table below.

| | Second support 200 made from Germanium | Second support 200 Silicon |
|---|---|---|
| Angle α of the prismatic cavity | 40 mrad ± 2 mrad | 40 mrad ± 2 mrad |
| Contrast of the fringes | 0.6 | 0.56 |
| Transmission coefficient | 0.49 | 0.52 |
| Maximum angular diameter of the source | 8.9° | 8.9° |
| Correction angle | 4.4° | 3.2° |
| Spectral resolution | 8.1 cm$^{-1}$ | 8.1 cm$^{-1}$ |
| Color of the central fringe | White | White |

A device according to the invention can make it possible to obtain a contrast of the fringes improved by at least one factor relative to a device according to the prior art and as described in document 7 330 266 B2.

The invention claimed is:

1. A micro-machined optical measuring device comprising:
a set of photosensitive detector elements situated on a first face of a first support, the photosensitive elements belonging to an imager; and
a second support, assembled to the first support, the second support including a first face through which radiation can penetrate and a second face positioned between the first face of the first support and the first face of the second support, the second face forming a non-zero angle θ with the first face of the second support and a non-zero angle α with the first face of the first support;
the second face being semi-reflective, the first support and the second support being positioned such that an interferometric cavity is made between the second face and the photosensitive detector elements, the interferometer cavity being a space delimited by a surface of the photosensitive elements and the semi-reflective face of the second support, positions of the first face of the first support and the second face of the second support being constant over time so as to form a static interferometric cavity, the device being an interferometric device of static interferometer type with two waves having at least partially a same spectral content.

2. The optical measuring device according to claim 1, the cavity being an air cavity.

3. The optical measuring device according to claim 1, the second support including a third face, parallel to and in contact with the first face of the first support.

4. The optical measuring device according to claim 3, further comprising an edge separating the third face and the second face of the second support, the edge running along a border of the set of photosensitive elements.

5. The optical measuring device according to claim 3, further comprising an edge separating the third face and the second face of the second support, the edge making a non-zero angle with a border of the set of photosensitive detector elements.

6. The optical measuring device according to claim 1, the first face of the second support having undergone an anti-reflection treatment.

7. The optical measuring device according to claim 1, wherein the photosensitive detector elements belong to a detection circuit connected to a reading circuit, to form the imager.

8. The optical measuring device according to claim 7, the imager being connected to an electronic spectral analysis device.

9. The optical measuring device according to claim 8, the imager being configured to be used as a spectrometer for performing at least one of interferometric and spectrometric measurements, from distribution of intensity of waves on a surface of the photosensitive detector elements.

10. The optical measuring device according to claim 7, wherein the reading circuit is integrated into a third support, the first support and the third support being assembled via conductive balls configured to ensure an electric connection between the reading circuit and the detection circuit.

11. The optical measuring device according to claim 10, the second support being kept in contact with the first support, via lugs or shims or balls between the second support and the third support.

12. The optical measuring device according to claim 10, the second support being kept in contact with the first support via beads of glue between the second support and the third support.

13. The optical measuring device according to claim 1, wherein a distance between the first face of the first support and the second face of the second support varies linearly.

14. The optical measuring device according to claim 1, wherein a surface of the photosensitive elements is semi-reflective.

15. A micro-machined optical measuring device comprising:
a set of photosensitive detector elements situated on a first face of a first support, the photosensitive elements belonging to an imager; and
a second support, assembled to the first support, the second support including a first face through which radiation can penetrate and a second face, forming a non-zero angle θ with the first face and a non-zero angle α with the first face of the first support;
the second face being semi-reflective, the first support and the second support being positioned such that an interferometric cavity is made between the second face and the photosensitive detector elements, the interferometer cavity being a space delimited by a surface of the photosensitive elements and the semi-reflective face of the second support, a distance between the first face of the first support and the second face of the second support varying, their position being constant over time so as to form a static interferometric cavity, the device being an interferometric device of static interferometer type with two waves having at least partially a same spectral content, and the second support including a third face, parallel to and in contact with the first face of the first support.

16. The optical measuring device according to claim 15, further comprising an edge separating the third face and the second face of the second support, the edge running along a border of the set of photosensitive elements.

17. The optical measuring device according to claim 15, further comprising an edge separating the third face and the second face of the second support, the edge making a non-zero angle with a border of the set of photosensitive detector elements.

* * * * *